(12) United States Patent  (10) Patent No.: US 8,471,836 B2
Lee et al.  (45) Date of Patent: Jun. 25, 2013

(54) ORGANIC LIGHT EMITTING DIODE DISPLAY

(75) Inventors: Jung-Min Lee, Yongin (KR); Choang-Ho Lee, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 744 days.

(21) Appl. No.: 12/712,389

(22) Filed: Feb. 25, 2010

(65) Prior Publication Data

US 2011/0122100 A1   May 26, 2011

(30) Foreign Application Priority Data

Nov. 24, 2009 (KR) .................. 10-2009-0114169

(51) Int. Cl.
    *G09G 5/00* (2006.01)
(52) U.S. Cl.
    USPC ............................................ 345/204; 345/77
(58) Field of Classification Search
    USPC ...................... 345/76–82, 204–215
    See application file for complete search history.

(56) References Cited

U.S. PATENT DOCUMENTS

| 2004/0207314 | A1 | 10/2004 | Aitken et al. | |
|---|---|---|---|---|
| 2010/0227524 | A1* | 9/2010 | Jung et al. | 445/25 |
| 2012/0309122 | A1* | 12/2012 | Oh et al. | 438/34 |

FOREIGN PATENT DOCUMENTS

| KR | 10-2007-0081570 A | 8/2007 |
|---|---|---|
| KR | 10-2007-0083154 A | 8/2007 |
| KR | 10-2008-0051756 A | 6/2008 |

OTHER PUBLICATIONS

Korean Notice of Allowance dated Mar. 12, 2013 in corresponding Korean Patent Application No. 10-2009-0114169 and Request for Entry of the Accompanying Notice of Allowance attached herewith.

\* cited by examiner

*Primary Examiner* — Vijay Shankar
(74) *Attorney, Agent, or Firm* — Robert E. Bushnell, Esq.

(57) ABSTRACT

An organic light emitting diode (OLED) display includes: a first substrate; an OLED disposed on the first substrate; a second substrate disposed opposite to the first substrate with the OLED interposed therebetween; and a sealant disposed between the first substrate and the second substrate to adhere and seal the first substrate and to form a predetermined gap to enclose the OLED, wherein a contact force between the sealant and the first substrate is 0.6 to 0.75 N/mm.

16 Claims, 11 Drawing Sheets

(2 of 11 Drawing Sheet(s) Filed in Color)

ORGANIC LIGHT EMITTING DIODE DISPLAY

CROSS-REFERENCE TO RELATED APPLICATION

This application claims priority to and the benefit of Korean Patent Application No. 10-2009-0114169 filed in the Korean Intellectual Property Office on Nov. 24, 2009, the entire contents of which are incorporated herein by reference.

BACKGROUND OF THE INVENTION

1. Field of the Invention

Aspects of the present invention relate to an organic light emitting diode (OLED) display. More particularly, aspects of the present invention relate to an OLED display and a method of manufacturing the OLED display including frit as a sealant.

2. Description of the Related Art

A display device is a device that displays an image, and currently, an OLED display is in the spotlight.

The OLED display has self luminous characteristics and does not require a separate light source, unlike a liquid crystal display (LCD), and thus can have reduced thickness and weight. Further, the OLED display represents high quality characteristics such as low power consumption, high luminance, and a high reaction speed.

In general, the OLED display includes a first substrate, an OLED disposed on the first substrate, a second substrate opposite to the first substrate with the OLED interposed therebetween, and a sealant such as frit that adheres and seals the first substrate and the second substrate.

In order to adhere and seal the first substrate and the second substrate, after interposing a sealant between the first substrate and the second substrate, forming a differential pressure between an inner space formed by the first substrate, the sealant, and the second substrate and an outer space the first substrate and the second substrate are pressed while interposing the sealant therebetween. Thereafter, the sealant is cured using a curing means such as laser, and a display substrate and an encapsulation substrate are adhered and sealed with the OLED therebetween.

Even if the sealant is cured, a differential pressure is formed between the inner space and the outer space of the OLED display by the differential pressure, and a central portion of at least one of the first substrate and the second substrate corresponding to the OLED is bent in the other one direction.

However, when the thickness of the sealant is larger than that of the OLED, a portion of the first substrate or of the second substrate contacting the sealant protrudes more than the other portion, and thus bending of the substrate occurs in the protruded portion. Therefore, when bending occurs at the protruded portion of the first substrate or of the second substrate, a Newton's ring phenomenon occurs in the bent portion.

In contrast, when a thickness of the sealant is smaller than that of the OLED, a Newton's ring phenomenon is minimized, but sufficient pressure is not applied to a portion of the first substrate or of the second substrate contacting the sealant to correspond to the sealant, whereby there is a problem that a failure occurs when adhering and sealing the first substrate and the second substrate with the sealant therebetween.

The above information disclosed in this Background section is only for enhancement of understanding of the background of the invention and therefore it may contain information that does not form the prior art that is already known in this country to a person of ordinary skill in the art.

SUMMARY OF THE INVENTION

An aspect of the present invention has been made in an effort to provide an OLED display having advantages of securely adhering and sealing a first substrate and a second substrate that interpose a sealant therebetween while minimizing a Newton's ring phenomenon.

An exemplary embodiment of the present invention provides an OLED display including: a first substrate; an OLED disposed on the first substrate; a second substrate opposite to the first substrate with the OLED interposed therebetween; and a sealant disposed between the first substrate and the second substrate to adhere and seal the first substrate and the second substrate and to form a predetermined gap between the first and second substrates, wherein the OLED is located with the predetermined gap and wherein a contact force between the sealant and the first substrate is 0.6 to 0.75 N/mm.

According to another aspect of the present invention, the sealant may be frit.

According to another aspect of the present invention, a distance from the sealant to the OLED may be substantially 1 mm.

According to another aspect of the present invention, a distance from the first substrate to a surface of the OLED that is opposite to the second substrate may be substantially 7 um.

According to another aspect of the present invention, a width of the sealant may be substantially 550 um, and a distance from a first surface of the first substrate corresponding to the sealant to a second surface of the second substrate that is opposite to the first surface may be 7 to 8 um.

According to another aspect of the present invention, a width of the sealant may be substantially 750 um, and a distance from a first surface of the first substrate corresponding to the sealant to a second surface of the second substrate that is opposite to the first surface may be 6.5 to 8 um.

According to another aspect of the present invention, the width of the sealant may be substantially 1000 um, and a distance from a first surface of the first substrate corresponding to the sealant to a second surface of the second substrate that is opposite to the first surface may be 6 to 8 um.

According to another aspect of the present invention, an OLED display that securely adheres and seals the first substrate and the second substrate that interpose a sealant therebetween while minimizing a Newton's ring phenomenon is provided.

Additional aspects and/or advantages of the invention will be set forth in part in the description which follows and, in part, will be obvious from the description, or may be learned by practice of the invention.

BRIEF DESCRIPTION OF THE DRAWINGS

The patent or application file contains at least one drawing executed in color. Copies of this patent or patent application publication with color drawing(s) will be provided by the U.S. Patent and Trademark Office upon request and payment of the necessary fee. The above and/or other aspects and advantages of the invention will become apparent and more readily appreciated from the following description of the embodiments, taken in conjunction with the accompanying drawings of which.

DETAILED DESCRIPTION OF THE EMBODIMENTS

Aspects of the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

Here, it is to be understood that where it is stated that one film or layer is "disposed on" a second layer or film, the first layer or film may be formed or disposed directly on the second layer or film or there may be intervening layers or films between the first layer or film and the second layer or film. Further, as used herein, the term "formed on" is used with the same meaning as "located on" or "disposed on" and is not meant to be limiting regarding any particular fabrication process. Further, some of the elements that are not essential to the complete understanding of the invention are omitted for clarity.

Further, a size and thickness of each of the elements that are displayed in the drawings are described for better understanding and ease of description and the aspects of the present invention are not limited by the described size and thickness.

In the drawings, the thickness of layers, films, panels, regions, etc., are exaggerated for clarity. In the drawings, for better understanding and ease of description, thicknesses of some layers and areas are excessively displayed.

Further, in the accompanying drawings, an active matrix (AM) OLED display of a 2Tr-1Cap structure having two thin film transistors (TFT) and one capacitor in one pixel is described, but the aspects of the present invention are not limited thereto. Therefore, the OLED display may have three or more TFTs and two or more capacitors in one pixel and may have various structures as a separate wire is further formed. Here, a pixel is a minimum unit that displays an image, and the OLED display displays an image through a plurality of pixels.

Hereinafter, an OLED display according to an exemplary embodiment of the present invention will be described with reference to FIGS. 1 to 4.

Figure 1:
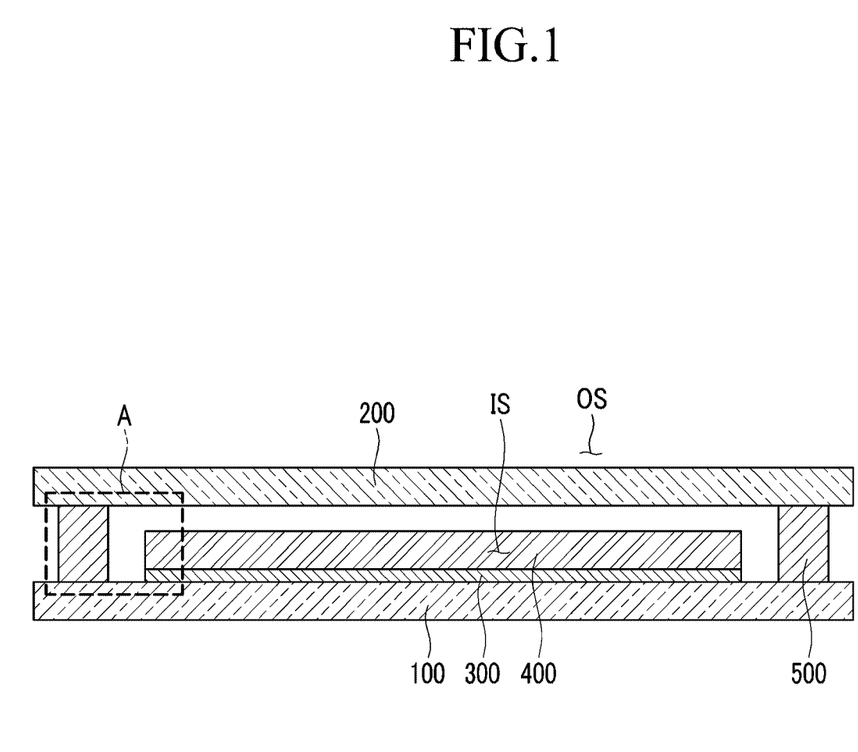
FIG. 1 is a cross-sectional view of an OLED display according to an exemplary embodiment of the present invention.

FIG. 1 is a cross-sectional view of an OLED display according to an exemplary embodiment of the present invention. As shown in FIG. 1, the OLED display according to the present exemplary embodiment includes a first substrate 100, a second substrate 200, a wire unit 300, an OLED 400, and a sealant 500.

The first substrate 100 and the second substrate 200 are insulation substrates including glass, a polymer, or stainless steel, and at least one of the first substrate 100 and the second substrate 200 is made of a light transmitting material. The wire unit 300 and the OLED 400 are disposed on the first substrate 100, and the second substrate 200 is opposite to the first substrate 100 with the wire unit 300 and the OLED 400 interposed therebetween. The first substrate 100 and the second substrate 200 are adhered and sealed by the sealant 500 with the OLED 400 interposed therebetween, and the first substrate 100 and the second substrate 200 protect the wire unit 300 and the OLED 400 from external interference.

The wire unit 300 includes first and second TFTs 10 and 20 (shown in FIG. 2) and drives the OLED 400 by transferring a signal to the OLED 400. The OLED 400 emits light according to a signal that is received from the wire unit 300.

The OLED 400 is disposed on the wire unit 300.

The OLED 400 is disposed at a display area on the first substrate 100 and is formed using microelectromechanical systems (MEMS) technology such as photolithography. The OLED 400 receives a signal from the wire unit 300 and displays an image by the received signal.

Hereinafter, an internal structure of an OLED display according to an exemplary embodiment of the present invention will be described in detail with reference to FIGS. 2 and 3.

Figure 2:
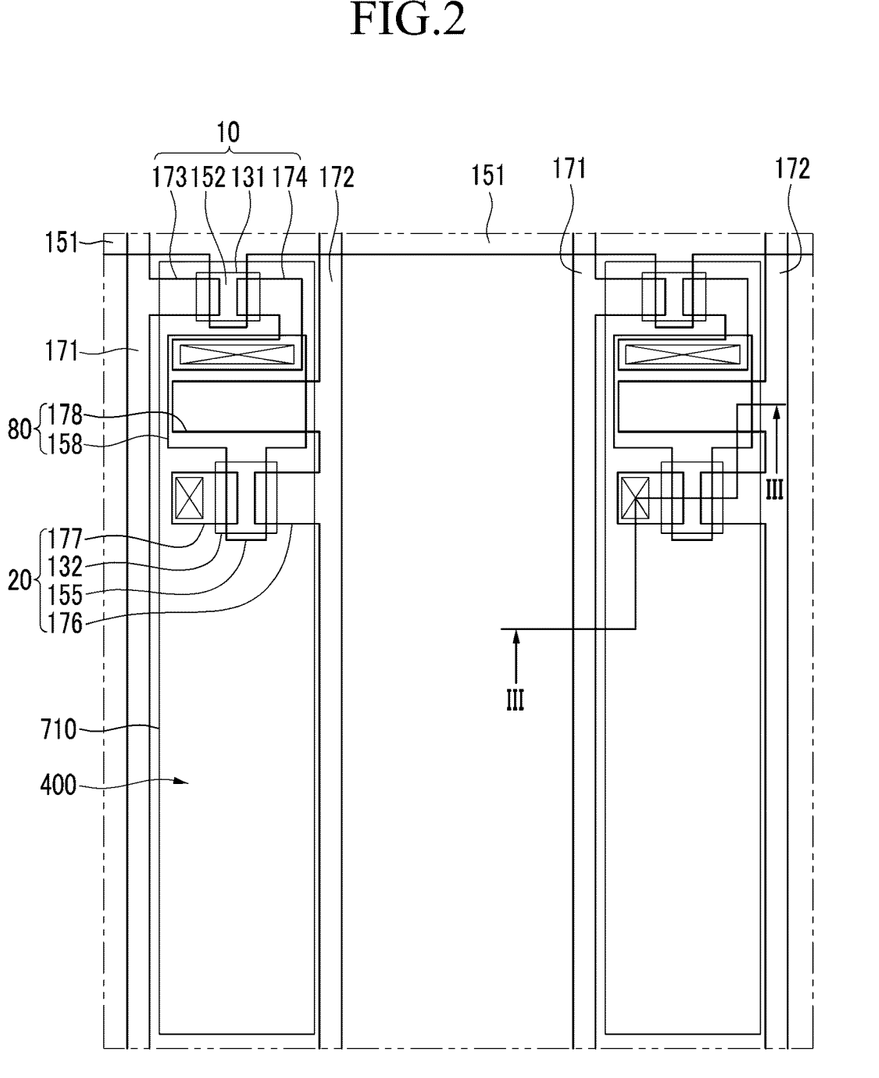
FIG. 2 is a layout view illustrating a structure of a pixel of an OLED display according to an exemplary embodiment of the present invention.

FIG. 2 is a layout view illustrating a structure of a pixel of an OLED display according to an exemplary embodiment of the present invention. FIG. 3 is a cross-sectional view of the pixel taken along line III-III of FIG. 2.

Figure 3:
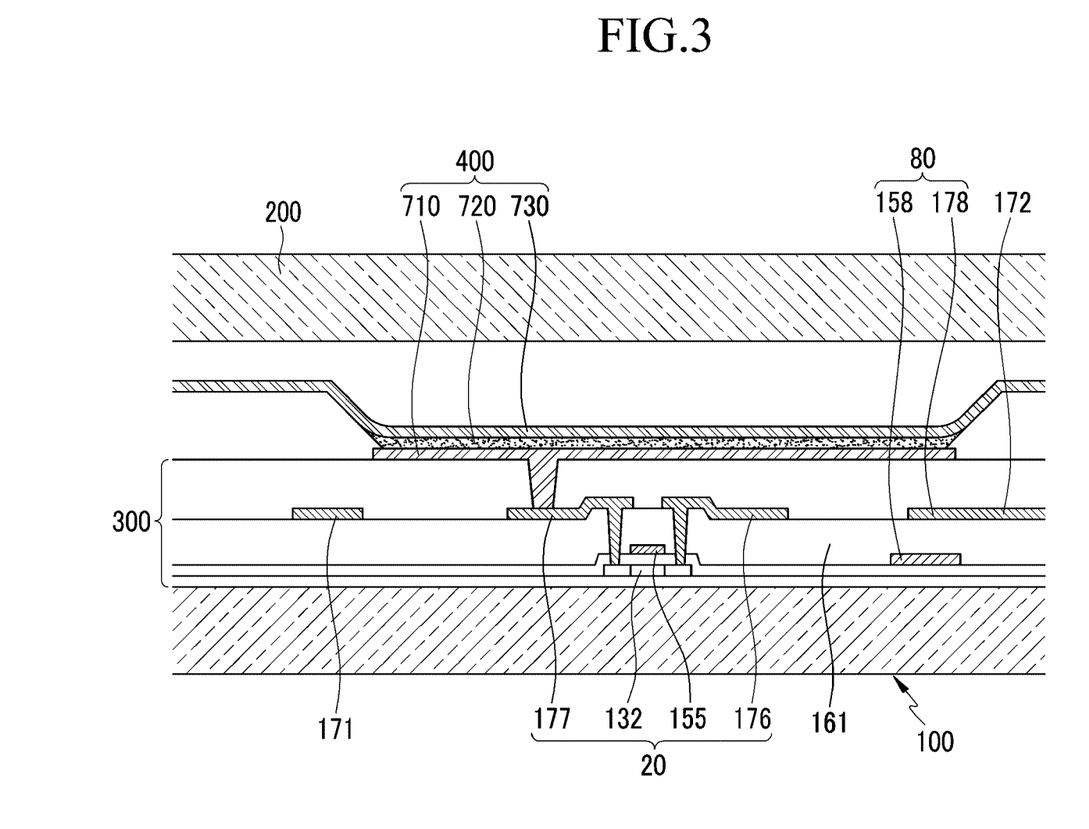
FIG. 3 is a cross-sectional view of the pixel taken along line III-Ill of FIG. 2.

Hereinafter, a detailed structure of the wire unit 300 and the OLED 400 is described in FIGS. 2 and 3, but an exemplary embodiment of the present invention is not limited to a structure that is shown in FIGS. 2 and 3. The wire unit 300 and the OLED 400 can be formed in various structures within a range that can be easily modified by a person of ordinary skill in the art. For example, in the accompanying drawings, as an OLED display, an AM OLED display of a 2Tr-1Cap structure having two TFTs and one capacitor in one pixel is described, but the aspects of the present invention are not limited thereto. Therefore, in the display device, the quantity of TFTs, the quantity of the capacitors, and the quantity of the wires are not limited. A pixel is a minimum unit that displays an image, and the OLED display displays an image through a plurality of pixels.

As shown in FIGS. 2 and 3, the OLED display includes a switching TFT 10, a driving TFT 20, a capacitor 80, and an OLED 400 that are each formed in each pixel. Here, a configuration including the switching TFT 10, the driving TFT 20, and the capacitor 80 is referred to as a wire unit 300. The wire unit 300 further includes a gate line 151 that is disposed in one direction of the first substrate 100, and a data line 171 and a common power source line 172 that are insulated from and intersect the gate line 151. Here, a pixel is defined by the gate line 151, the data line 171, and the common power source line 172 as the boundary, but a pixel is not limited thereto.

The OLED 400 includes a first electrode 710, an organic emission layer 720 that is formed on the first electrode 710, and a second electrode 730 that is formed on the organic emission layer 720, and the first electrode 710, the organic emission layer 720, and the second electrode 730 form the OLED 400. Here, the first electrode 710 becomes a cathode, which is an electron injection electrode, and the second electrode 730 becomes an anode, which is a hole injection electrode. However, an exemplary embodiment of the present invention is not limited thereto, and the first electrode 710 may become an anode and the second electrode 730 may become a cathode according to a driving method of the OLED display. When electrons and holes are injected into the organic emission layer 720 from the first electrode 710 and the second electrode 730, respectively, and when excitons that are formed by coupling of holes and electrons that are injected into the organic emission layer 720 drop from an excited state to a ground state, the organic emission layer 720 emits light. Further, at least one of the first electrode 710 and the second electrode 730 is made of a transparent or semi-transparent conductive material, and as a transparent or semi-transparent conductive material, indium tin oxide (ITO) and indium zinc oxide (IZO) are used.

Further, in the OLED display according to an exemplary embodiment of the present invention, the OLED 400 emits light in at least one direction of the first substrate 100 and the second substrate 200. That is, the OLED display according to an exemplary embodiment of the present invention is a front light emitting type, a rear light emitting type, or both light emitting types.

The capacitor 80 includes a pair of capacitor plates 158 and 178 that are disposed with the interlayer insulating layer 161 interposed therebetween. Here, the interlayer insulating layer 161 becomes a dielectric material, and a capacitor capacity of the capacitor 80 is determined by charges that are stored in the capacitor 80 and a voltage between both capacitor plates 158 and 178.

The switching TFT 10 includes a switching semiconductor layer 131, a switching gate electrode 152, a switching source electrode 173, and a switching drain electrode 174. The driving TFT 20 includes a driving semiconductor layer 132, a driving gate electrode 155, a driving source electrode 176, and a driving drain electrode 177.

The switching TFT 10 is used as a switch that selects a pixel to emit light. The switching gate electrode 152 is connected to the gate line 151. The switching source electrode 173 is connected to the data line 171. The switching drain electrode 174 is separated from the switching source electrode 173 and is connected to one capacitor plate 158.

The driving TFT 20 applies a power source for allowing light emitting of the organic emission layer 720 of the OLED 400 within the selected pixel to the second electrode 730. The driving gate electrode 155 is connected to the capacitor plate 158 that is connected to the switching drain electrode 174. The driving source electrode 176 and the other one capacitor plate 178 are each connected to a common power source line 172. The driving drain electrode 177 is connected to the second electrode 730 of the OLED 400 through a contact hole.

By such a structure, the switching TFT 10 operates by a gate voltage that is applied to the gate line 151 and thus performs a function of transferring a data voltage that is applied to the data line 171 to the driving TFT 20. A voltage corresponding to a difference between a common voltage that is applied from the common power source line 172 to the driving TFT 20 and a data voltage that is transferred from the switching TFT 10 is stored in the capacitor 80, and a current corresponding to the voltage that is stored in the capacitor 80 flows to the OLED 400 through the driving TFT 20, whereby the OLED 400 emits light.

Referring again to FIG. 1, the sealant 500 is disposed between the first substrate 100 and the second substrate 200, and is disposed along the edge of the first substrate 100 and the second substrate 200 to adhere and seal the first substrate 100 and the second substrate 200. The sealant 500 includes frit, and is cured by a curing process such as a laser. A differential pressure of substantially 1 atmosphere is formed between an inner space IS of the OLED display that is formed by the sealant 500, the first substrate 100, and the second substrate 200 and an outer space OS of the OLED display.

Hereinafter, a numerical value of constituent elements constituting an OLED display according to an exemplary embodiment of the present invention will be described with reference to FIG. 4. A numerical value of constituent elements constituting an OLED display according to an exemplary embodiment of the present invention is an optimum numerical value that is obtained by experiments.

Figure 4:
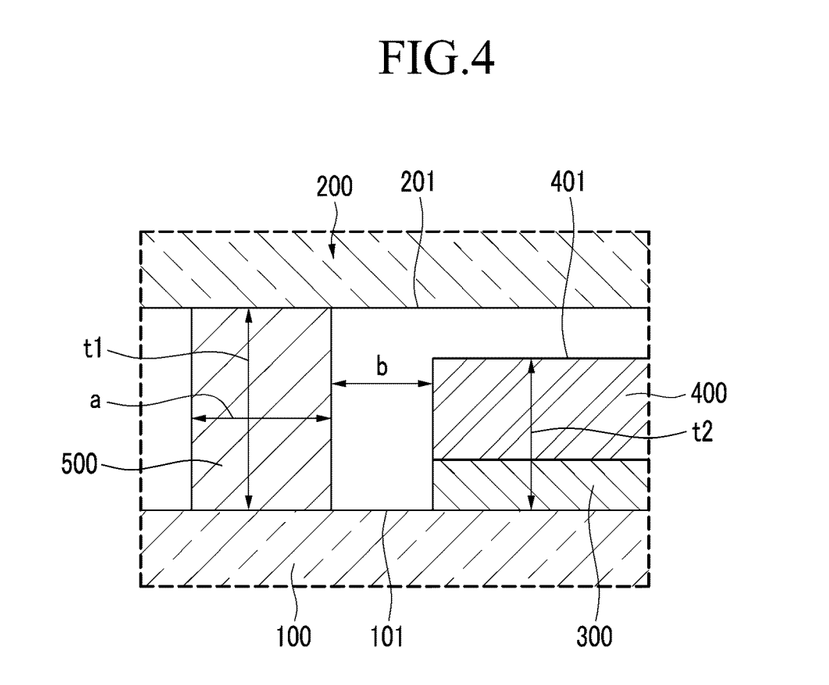
FIG. 4 is an enlarged view of a portion A that is shown in FIG. 1.

FIG. 4 is an enlarged view of a portion A that is shown in FIG. 1. As shown in FIG. 4, the sealant 500 contacts the first substrate 100 and the second substrate 200. Here, a contact force between the sealant 500 and the first substrate 100 is 0.6 to 0.75 N/mm, and when a contact force between the sealant 500 and the first substrate 100 is 0.6 to 0.75 N/mm, while bending of a portion of the second substrate 200 corresponding to the sealant 500 is minimized, the sealant 500 is pressurized by the first substrate 100 and the second substrate 200, thereby, adhering and sealing the first substrate 100 and the second substrate 200. A contact force 0.6 to 0.75 N/mm between the sealant 500 and the first substrate 100 is obtained by experiments.

The wire unit 300 includes at least one passivation layer that is disposed between wires, and the passivation layer that is included in the wire unit 300 is disposed on the first substrate 100. In this case, the sealant 500 contacts the passivation layer of the first substrate 100, creating the contact force between the passivation layer of the first substrate 100 and the sealant 500.

Further, a distance b from the sealant 500 to the OLED 400 is substantially 1 mm, and a distance t2 from the first surface 101 of the first substrate 100 to a surface 401 of the OLED 400 that is opposite to the second substrate 200 is substantially 7 um.

Further, when a width a of the sealant 500 is substantially 550 um, a distance t1 from the first surface 101 of the first substrate 100 corresponding to the sealant 500 to a second surface 201 of the second substrate 200 that is opposite to the first surface 101 is 7 to 8 um.

Further, when a width a of the sealant 500 is substantially 750 um, a distance t1 from the first surface 101 of the first substrate 100 corresponding to the sealant 500 to the second surface 201 of the second substrate 200 that is opposite to the first surface 101 is 6.5 to 8 um.

Further, when a width a of the sealant 500 is substantially 1000 um, a distance t1 from the first surface 101 of the first substrate 100 corresponding to the sealant 500 to the second surface 201 of the second substrate 200 that is opposite to the first surface 101 is 6 to 8 um.

Numerical values of the above-described b, a, t2, and t1 are obtained through a simulation experiment using ABAQUS, which is a structure, electricity, and heat analysis tool of SIMULIA sold by Dassault Systemes company, and such an experiment will be described hereinafter in detail with reference to FIGS. 5 to 8. Before performing the experiment, a distance t2 from the first substrate 100 to a surface 401 of the OLED 400 that is opposite to the second substrate 200 is set to substantially 7 um.

Figure 5A:
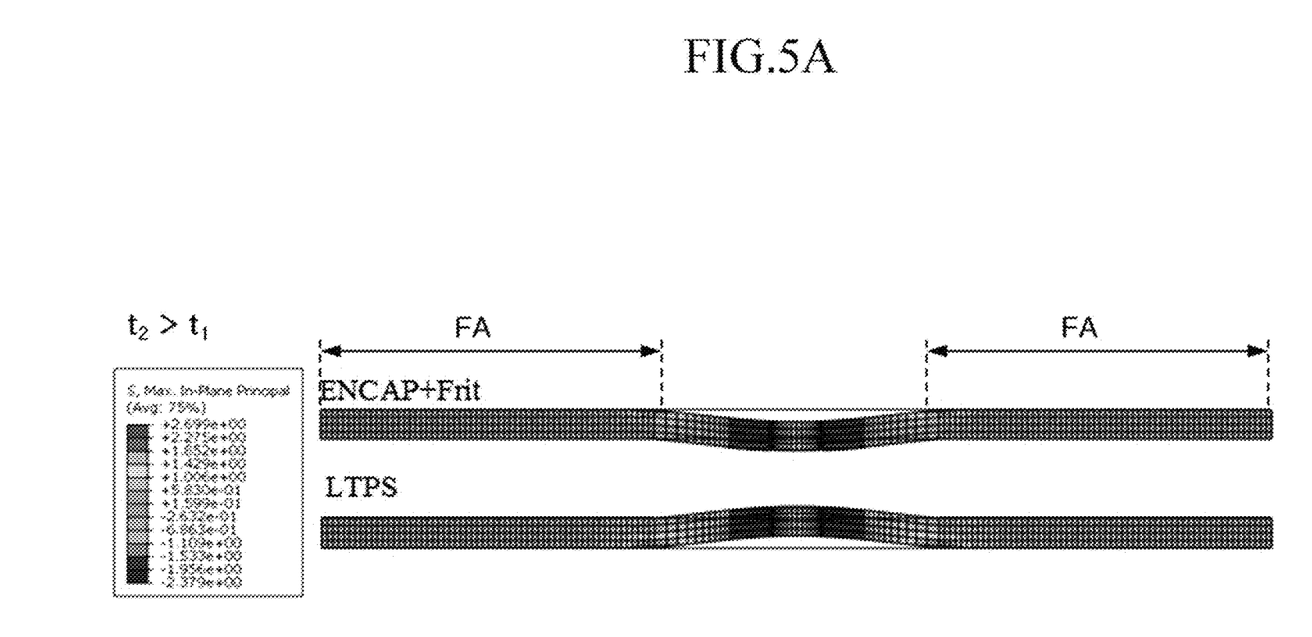
FIGS. 5A and 5B are diagrams illustrating an experiment that obtains an OLED display according to an exemplary embodiment of the present invention.
Figure 5B:
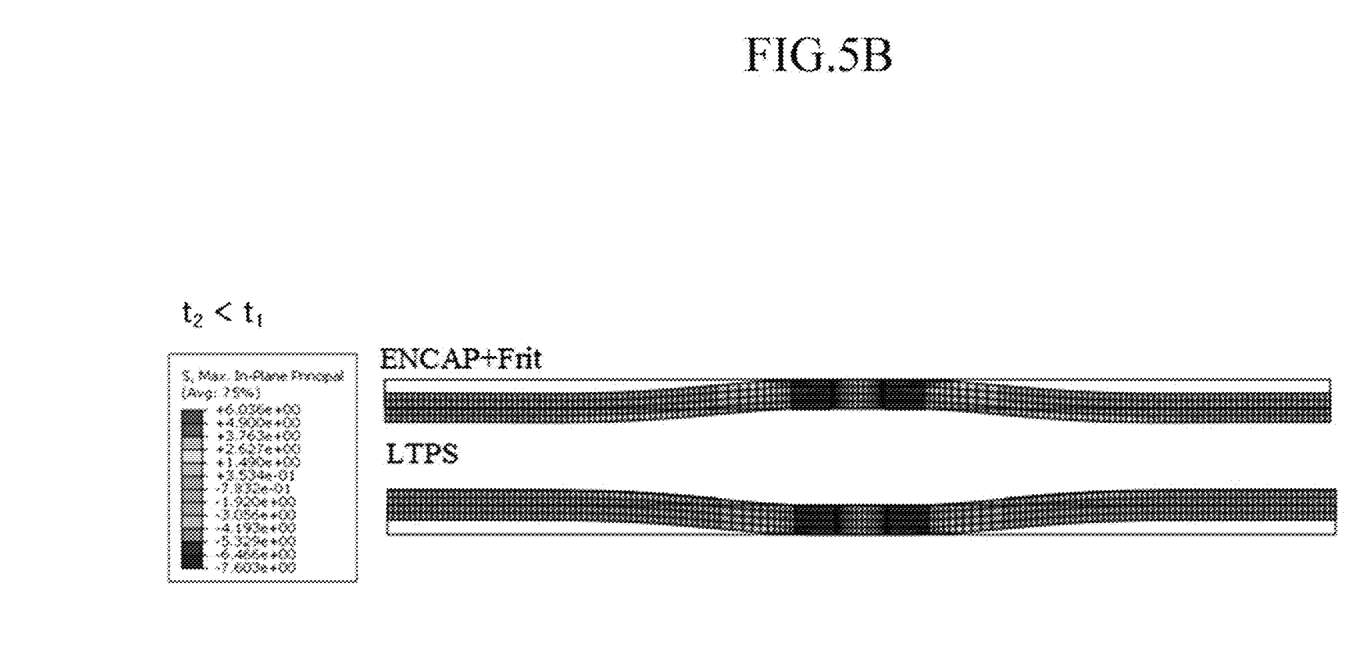

FIGS. 5A and 5B are diagrams illustrating an experiment that obtains an OLED display according to an exemplary embodiment of the present invention. FIGS. 6A to 8 are graphs illustrating an experiment that obtains an OLED display according to an exemplary embodiment of the present invention.

FIGS. 5A and 5B illustrate a modified shape of a section of the first substrate 100 and the second substrate 200 according to a relative height of a pixel area FA at which the sealant 500, which is frit, and the OLED 400 are disposed. Here, LTPS is the first substrate 100, and ENCAP+Frit is the second substrate 200 in which the sealant 500 is coated.

As shown in FIG. 5A, if t1 is smaller than t2, the frit does not appropriately press contact the first substrate 100 and thus adhesion failure may occur between the first substrate 100 and the second substrate 200 that interpose the sealant 500 therebetween, but because the first substrate 100 and the second substrate 200 sustain a flat state in a pixel area FA, a Newton's ring does not occur in the pixel area FA.

As shown in FIG. 5B, if t1 is larger than t2, a portion of the first substrate 100 and the second substrate 200 corresponding to the sealant 500 protrudes in an outward direction and thus a bent portion occurs in a pixel area FA, whereby a Newton's ring occurs.

Figure 6A:
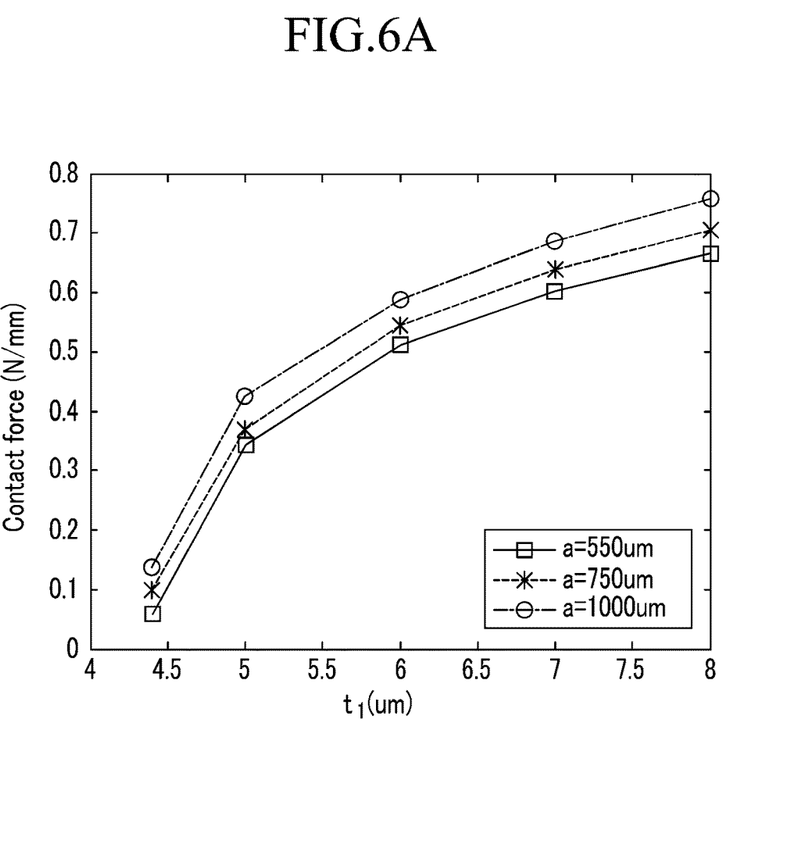
FIGS. 6A-6B, 7A-7B and 8 are graphs illustrating an experiment that obtains an OLED display according to an exemplary embodiment of the present invention.
Figure 6B:
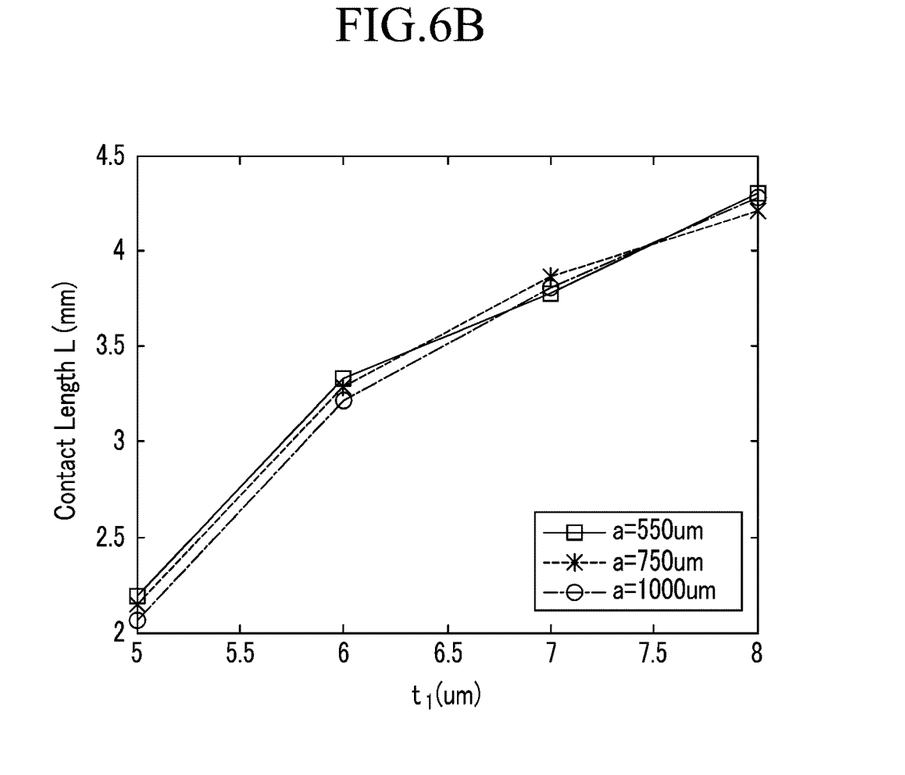

According to such an experiment, in the following description, while changing a numerical value of each of the constituent elements constituting the OLED display, a contact force between the first substrate 100 and the sealant 500, and a contact length L, which is a length from the sealant 500 to a contact portion of the second substrate 200 and the OLED 400, are shown in FIGS. 6A and 6B.

As shown in FIG. 6A, as t1 is lengthened and a width a of the sealant 500 is widened, a contact force increases.

Further, as shown in FIG. 6B, a contact length L has no large relevance to a width a of the sealant 500, and when t1 is lengthened, the contact length L is lengthened.

Figure 7A:
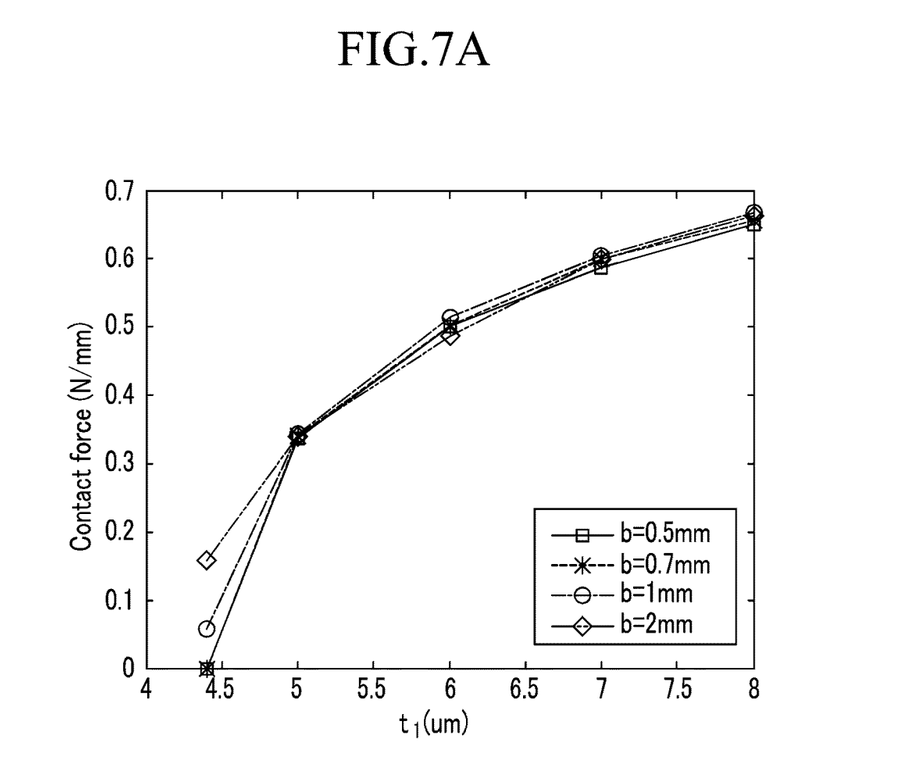
Figure 7B:
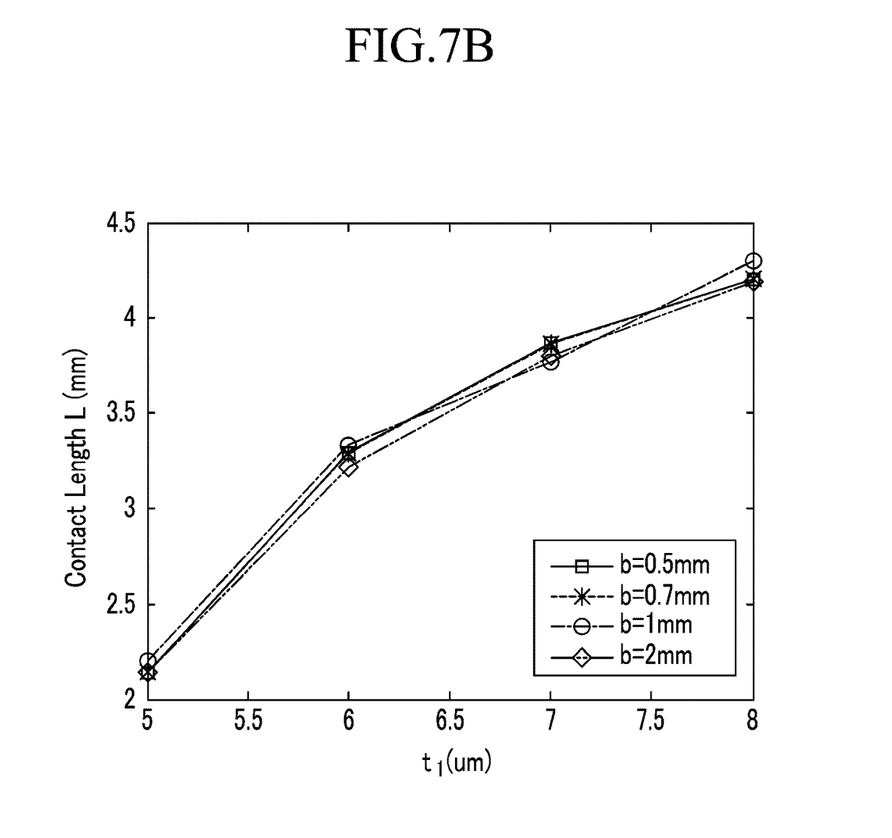

Similarly, while changing a numerical value of each of the constituent elements constituting the OLED display and changing a design variable, a contact force between the first substrate 100 and the sealant 500 and a contact length L, which is a length from the sealant 500 to a contact portion of the second substrate 200 and the OLED 400, are shown in FIGS. 7A and 7B.

As shown in FIG. 7A, as t1 is lengthened, a contact force increases and has no great influence on a distance b from the sealant 500 to the OLED 400, as shown in FIG. 6A. However, if a distance b is 0.7 mm or less, the sealant 500 does not contact the first substrate 100 and thereby the distance b becomes substantially 1.0 mm.

As shown in FIG. 7B, as t1 is lengthened, a contact length L is also lengthened, as shown in FIG. 6B, but the contact length L has no great influence on a distance b from the sealant 500 to the OLED 400.

The following design rule is obtained by the above experiment.

First, a condition where no problem exists in adhering and sealing between the first substrate 100 and the second substrate 200 that interpose the sealant 500 that is verified by an experiment therebetween is a condition in which t1 is larger than 7 um and a width a is larger than 550 um, and a distance b is substantially 1.0 mm so that a contact force between the sealant 500 and the first substrate 100 is set to 0.6 to 0.75 N/mm.

However, in such a condition, a Newton's ring is excessively exhibited.

Figure 8:
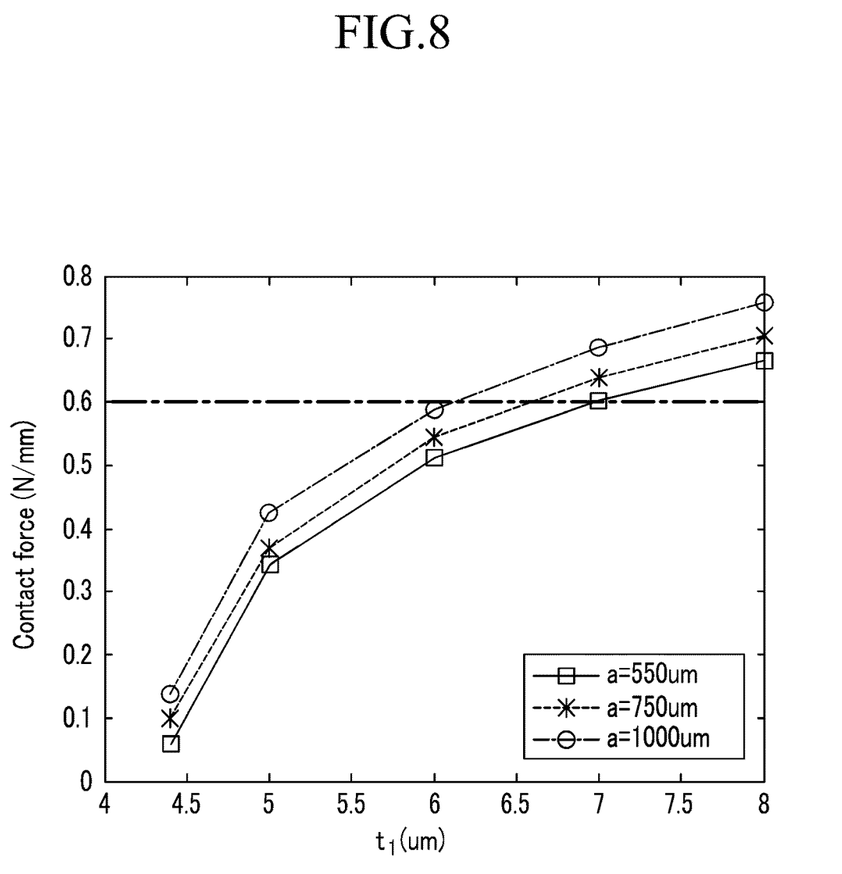

Therefore, in such an identical condition, a contact force where a width a is 550 um, 750 um, or 1000 um is shown in FIG. 8.

As shown in FIG. 8, where a distance b of the OLED 400 is substantially 1 mm and a distance t2 from the first substrate 100 to the surface 401 of the OLED 400 that is opposite to the second substrate 200 is set to substantially 7 um, when the width a of the sealant 500 is substantially 550 um, and if t1 is 7 to 8 um, a contact force between the first substrate 100 and the sealant 500 is 0.6 to 0.75 N/mm.

Further, when the width a of the sealant 500 is substantially 750 um, and if t1 is 6.5 to 8 um, a contact force between the first substrate 100 and the sealant 500 is 0.6 to 0.75 N/mm.

Further, when a width of the sealant 500 is substantially 1000 um, and if t1 is 6 to 8 um, a contact force between the first substrate 100 and the sealant 500 is 0.6 to 0.75 N/mm.

By the above experiment, when a distance b is set to substantially 1.0 mm and t2 is set to substantially 0.7 um, and if a width a of the sealant 500 is set to substantially 550 um and if t1 is set to approximately 7 to 8 um, and if a width a is set to substantially 750 um and if t1 is set to approximately 6.5 to 8 um, or if a width a is set to substantially 1000 um and if t1 is set to approximately 6 to 8 um, a contact force between the first substrate 100 and the sealant 500 is formed at approximately 0.6 to 0.75 N/mm and thus pressing between the first substrate 100 and the second substrate 200 that interpose the sealant 500 therebetween is smoothly performed. Thereby, adhesion and sealing between the first substrate 100 and the second substrate 200 that interpose the sealant 500 therebetween is well performed.

Further, if b, a, t2, and t1 are set as described above, a length of t1 is reduced by 0.1 mm to 1 mm, compared with t2, which is substantially 7 um, and thus the length of a section in which a Newton's ring may occur reduces, whereby bending of a portion of the second substrate 200 corresponding to the sealant 500 is minimized.

That is, in an OLED display according to an exemplary embodiment of the present invention, as b, a, t2, and t1 are numerically limited, while bending a portion of the second substrate 200 corresponding to the sealant 500 is minimized, the sealant 500 is pressurized by the first substrate 100 and the second substrate 200 and thus adhering and sealing between the first substrate 100 and the second substrate 200 that interpose the sealant 500 therebetween is well performed.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of forming an organic light emitting diode (OLED) display, the method comprising:
   providing a first substrate;
   forming a wire unit on the first substrate;
   forming an OLED on the wire unit;
   forming a second substrate opposite to the first substrate and separated from the first substrate by a predetermined distance; and
   forming a sealant disposed between the first substrate and the second substrate to adhere and seal the first substrate and the second substrate thereby forming a gap that encloses the OLED,
   wherein the sealant contacts the first and second substrates with a force of approximately 0.6 to 0.75 N/mm.

2. An organic light emitting diode (OLED) display comprising:
   a first substrate;
   an OLED disposed on the first substrate;
   a second substrate disposed opposite to the first substrate with the OLED interposed therebetween; and
   a sealant disposed between the first substrate and the second substrate to adhere and seal the first substrate and the second substrate and to form a predetermined gap between the first and second substrates where the OLED is located, wherein a contact force between the sealant and the first substrate is 0.6 to 0.75 N/mm.

3. The OLED display of claim 2, wherein the sealant is frit.

4. The OLED display of claim 3, wherein a distance from the sealant to the OLED is substantially 1 mm.

5. The OLED display of claim 4, wherein a distance from the first substrate to a surface of the OLED that is opposite to the second substrate is substantially 7 um.

6. The OLED display of claim 5, wherein a width of the sealant is substantially 550 um, and a distance from a first surface of the first substrate corresponding to the sealant to a second surface of the second substrate that is opposite to the first surface is 7 to 8 um.

7. The OLED display of claim 5, wherein a width of the sealant is substantially 750 um, and a distance from a first surface of the first substrate corresponding to the sealant to a second surface of the second substrate that is opposite to the first surface is 6.5 to 8 um.

8. The OLED display of claim 5, wherein a width of the sealant is substantially 1000 um, and a distance from a first surface of the first substrate corresponding to the sealant to a second surface of the second substrate that is opposite to the first surface is 6 to 8 um.

9. The OLED display of claim 2, further comprising a wire unit disposed between the first substrate and the OLED.

10. The OLED display of claim 9, wherein the wire unit includes first and second thin film transistors (TFTs) that drive the OLED by transferring a signal to the OLED and a capacitor.

11. The OLED display of claim 10, wherein the OLED is disposed on a display area of the first substrate.

12. The OLED display of claim 10, wherein the first TFT is a switching thin film transistor (TFT), and the second TFT is a driving TFT.

13. An organic light emitting diode (OLED) display comprising:

a first substrate;

a wire unit disposed on the first substrate;

an OLED disposed on the wire unit;

a second substrate placed opposite to the first substrate and separated from the first substrate by a predetermined distance; and a sealant disposed between the first substrate and the second substrate having a height equal to the predetermined distance, wherein the predetermined distance separating the first substrate from the second substrate is in a range between 6 to 8 μm.

14. The OLED display of claim 13, wherein a distance from the sealant to the OLED is approximately 1 mm.

15. The OLED display of claim 13, wherein a width of the sealant is in a range between 550 μm and 750 μm.

16. The OLED display of claim 13, wherein a width of the sealant is approximately 1000 μm.

* * * * *